(12) United States Patent
Janson

(10) Patent No.: US 7,287,203 B1
(45) Date of Patent: Oct. 23, 2007

(54) TESTING EMBEDDED RAM BLOCKS BY EMPLOYING RAM SCAN TECHNIQUES

(75) Inventor: Paul E. Janson, Bolton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 231 days.

(21) Appl. No.: 11/194,540

(22) Filed: Aug. 2, 2005

(51) Int. Cl.
*G11C 29/00* (2006.01)
(52) U.S. Cl. .................. 714/718; 714/726
(58) Field of Classification Search .......... 714/718, 714/20, 733, 726; 324/31; 365/201
See application file for complete search history.

(56) References Cited

U.S. PATENT DOCUMENTS

| | | | | |
|---|---|---|---|---|
| 4,969,148 A | * | 11/1990 | Nadeau-Dostie et al. ... | 714/718 |
| 5,006,787 A | * | 4/1991 | Katircioglu et al. ...... | 324/73.1 |
| 5,132,973 A | * | 7/1992 | Obermeyer .............. | 714/718 |
| 5,469,443 A | * | 11/1995 | Saxena ................... | 714/720 |
| 5,689,466 A | * | 11/1997 | Qureshi .................. | 365/201 |
| 6,668,347 B1 | * | 12/2003 | Babella et al. .......... | 714/733 |

OTHER PUBLICATIONS

Product Data Sheet, "Two Port SRAIM 32 Words 32 Bits per word", Virtual Silicon Technology, Inc., Sunnyvale, CA, 2002.

* cited by examiner

*Primary Examiner*—David Ton
(74) *Attorney, Agent, or Firm*—Manelli Denison & Selter PLLC; Leon R. Turkevich

(57) ABSTRACT

A method is provided for testing RAM blocks embedded in an integrated circuit. The method provides a scan circuit embedded in an integrated circuit. The scan circuit includes a RAM block, a plurality of first flip-flops each sending a read address to the RAM block, a plurality of second flip-flops each sending a write address to the RAM block, a plurality of third flip-flops each sending an enable signal to the RAM block, a plurality of fourth flip-flops, and a multiplexer receiving an output from the RAM block, the first, second, third and fourth flip-flops being connected in series. An internal scan test is performed by loading serial data into the first, second, third and fourth flip-flops.

18 Claims, 6 Drawing Sheets

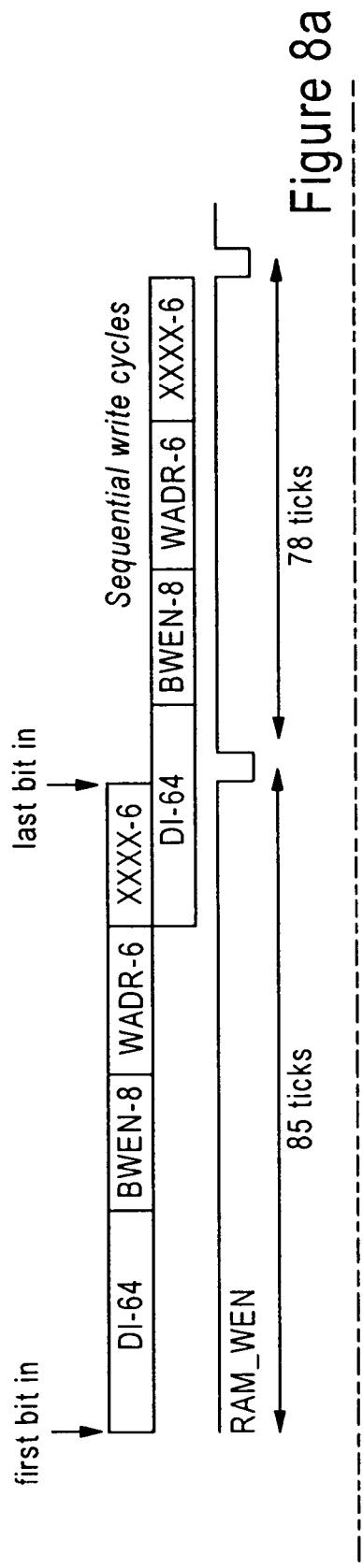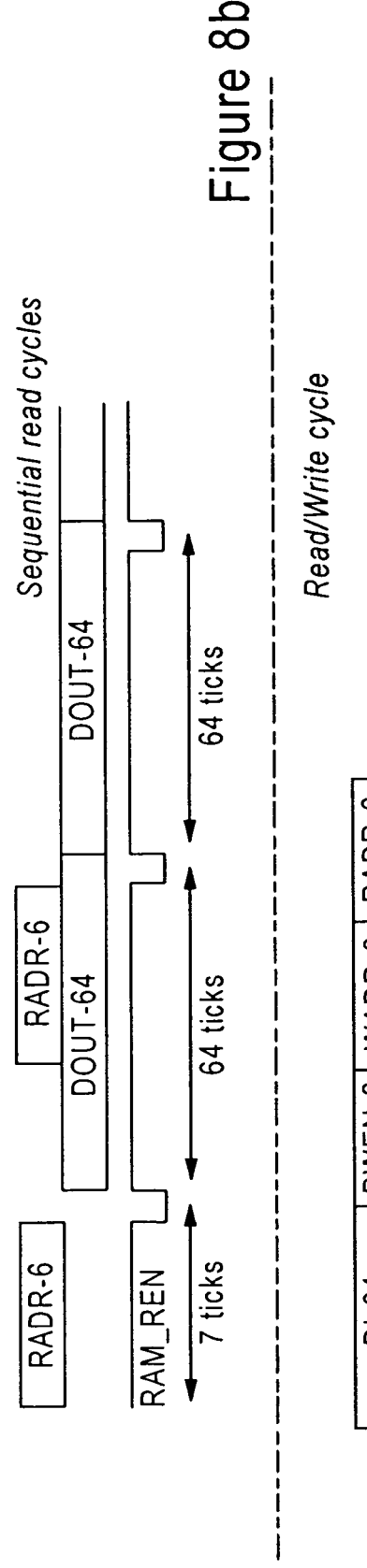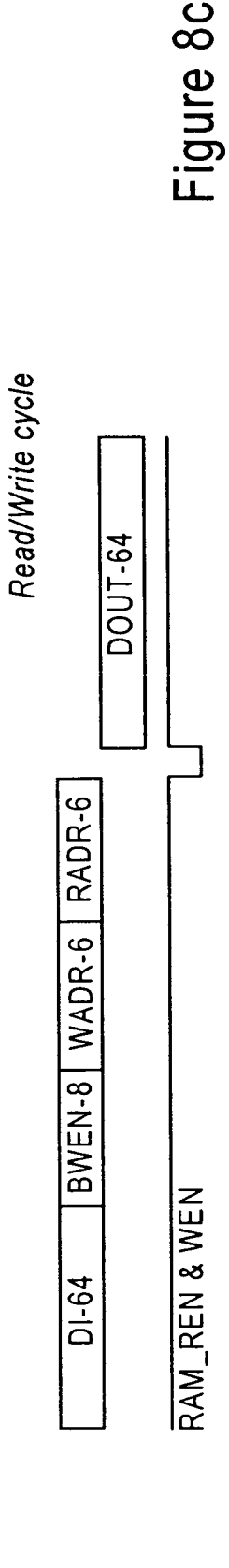

TESTING EMBEDDED RAM BLOCKS BY EMPLOYING RAM SCAN TECHNIQUES

BACKGROUND OF THE INVENTION

1. Field of the Invention

The present invention relates to testing RAM blocks embedded in an integrated circuit and, more particularly, to internal RAM scan chain testing and RAM scan testing of RAM blocks.

2. Background Art

Certain integrated circuits can have a number of embedded RAM blocks. An example of a 32×32 RAM block is shown, generally indicated at 10, in FIG. 1. All the flip-flops and multiplexers (mux) are inside of the RAM block. All of the inputs 11, except for the clocks (e.g., RCK, WCK), have both a normal functional input as well as a Built In Self Test (BIST) input, which are multiplexed together to drive registers 13. A clock enable pin (CEB), when asserted low, enables a flip-flop 13 to be loaded from the D input pin. Otherwise, the flip-flop does not change state. Thus, the internal registers 13 are updated only when REN/WEN or BIST_REN/BIST_WEN is asserted.

A 64×64 RAM block is similar in structure to the 32×32 RAM block. The address widths are six and the data widths are sixty-four. Additionally, the 64×64 RAM block has a byte write enable (BWEN) function. There are eight BWEN inputs and eight BIST_BWEN inputs that control the writing of the eight bytes within the sixty-four-bit word. These signals are active low, for example, BWEN=8'b1111_0011 will enable the $3^{rd}$ and $4^{th}$ bytes to be written into the memory; the other bytes remain unchanged. In certain integrated circuits, the OEN and BIST_OEN inputs are always asserted low, so the DOUT outputs are always driving, and there are sixteen instances of the 32×32 RAM block and eight instances of the 64×64 Ram block for a total of twenty-four RAM blocks.

During manufacturing of an integrated circuit, it is desirable to test for defects inside of each of the twenty-four RAM blocks. It would be preferable to bring the address and data pins of the RAM block out to pins on the chip, so one could have access to the address and data for testing. However, this approach requires a significant amount of pins and wiring to bring the RAM blocks out to chip pins, which is not practical.

Another approach is to rely on a functional test wherein normal activity is run through the chip to hopefully exercise all of the RAM addresses. However, this approach requires significant activity at the chip level in order to exercise all of the RAM addresses and appropriate data patterns.

Furthermore, it is desirable to employ Automatic Test Pattern Generation (ATPG) tools in testing integrated circuits with embedded RAM blocks. These tools build a model of the chip and detect "stuck at" faults, e.g., "stuck at 1", or "stuck at 0", monitored at input and outputs of circuits. These tools generate patterns to control an internal point (e.g., set an output of a gate high). In addition, if there is a fault at an internal point, then that fault needs to be propagated to an output point or pin, where the APTG tool can observe that there is an internal fault. Thus, when attempting to drive a pin high and the pin output is stuck at low fault, this condition will be detected by observing an output pin. Typically, the ATPG tools cannot handle setting an address or creating the correct timing sequences on clock pins to change the contents of the RAM and check the output. As shown in FIG. 2, the RAM block 10 is a "black hole" blocking the ability to observe faults propagated to the RAM inputs, and preventing control of RAM outputs, which drive downstream logic.

SUMMARY OF THE INVENTION

There is a need to provide a RAM scan test that uses few pins yet enables the RAM blocks to be tested individually, and to effectively use ATPG tools in the testing.

An object of the present invention is to fulfill the need referred to above. In accordance with the principles of the present invention, this objective is achieved by providing a method of testing RAM blocks embedded in an integrated circuit. The method provides a scan circuit including a RAM block, a plurality of first flip-flops each sending a read address to the RAM block, a plurality of second flip-flops each sending a write address to the RAM block, a plurality of third flip-flops each sending an enable signal to the RAM block, a plurality of fourth flip-flops, and a multiplexer receiving an output from the RAM block. The first, second, third and fourth flip-flops are connected in series. An internal scan test is performed by loading serial data into the first, second, third and fourth flip-flops. Data captured by at least the fourth flip-flops is observed. An output of each fourth flip-flop bypasses the RAM block and is received by the multiplexer, with signals output by the multiplexer being controlled. A RAM scan test is performed by a combination of loading serial data into the first, second, third, and fourth flip-flops of the RAM block, triggering a RAM write cycle to latch data in the second, third and fourth flip-flops to the RAM block, triggering a RAM read cycle with data of the first flip-flops being latched by the RAM block and data of a specified read address being output from the RAM block and received by the multiplexer and by the fourth flip-flops, and outputting the data of the specified read address from the fourth flip-flops.

In accordance with another aspect of the invention, an integrated circuit includes an embedded RAM scan circuit. The RAM scan circuit includes a RAM block, a plurality of first flip-flops each sending a read address to the RAM block, a plurality of second flip-flops each sending a write address to the RAM block, a plurality of third flip-flops each sending a byte write enable signal to the RAM block, a multiplexer receiving an output from the RAM block, a controller constructed and arranged to control the multiplexer and thus the output from the RAM block, a plurality of fourth flip-flops each constructed and arranged to capture data so that the captured data can be observed, an output of each fourth flip-flop being connected with the multiplexer in a manner that bypasses the RAM block, thereby permitting signals output by the multiplexer to be controlled by the controller. An output of the multiplexer is received by each fourth flip-flop. The first, second, third, and fourth flip-flops are connected in series. Input structure is constructed and arranged to permit input of data to the plurality of first, second, third, and fourth flip-flops. A first trigger is constructed and arranged to trigger a RAM write cycle to latch data in the plurality of second, third and fourth flip-flops to the RAM block. A second trigger is constructed and arranged to trigger a RAM read cycle to output a specified read address from the RAM block that is received by the multiplexer and thus by the fourth flip-flops. Output structure is constructed and arranged to permit an output of data from the fourth flip-flops.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein:

FIG. 8*a* is a write cycle diagram in accordance with an embodiment of the invention.

FIG. 8*b* is a read cycle diagram in accordance with an embodiment of the invention.

FIG. 8*c* is a read/write cycle diagram in accordance with an embodiment of the invention.

BEST MODE FOR CARRYING OUT THE INVENTION

Figure 1:
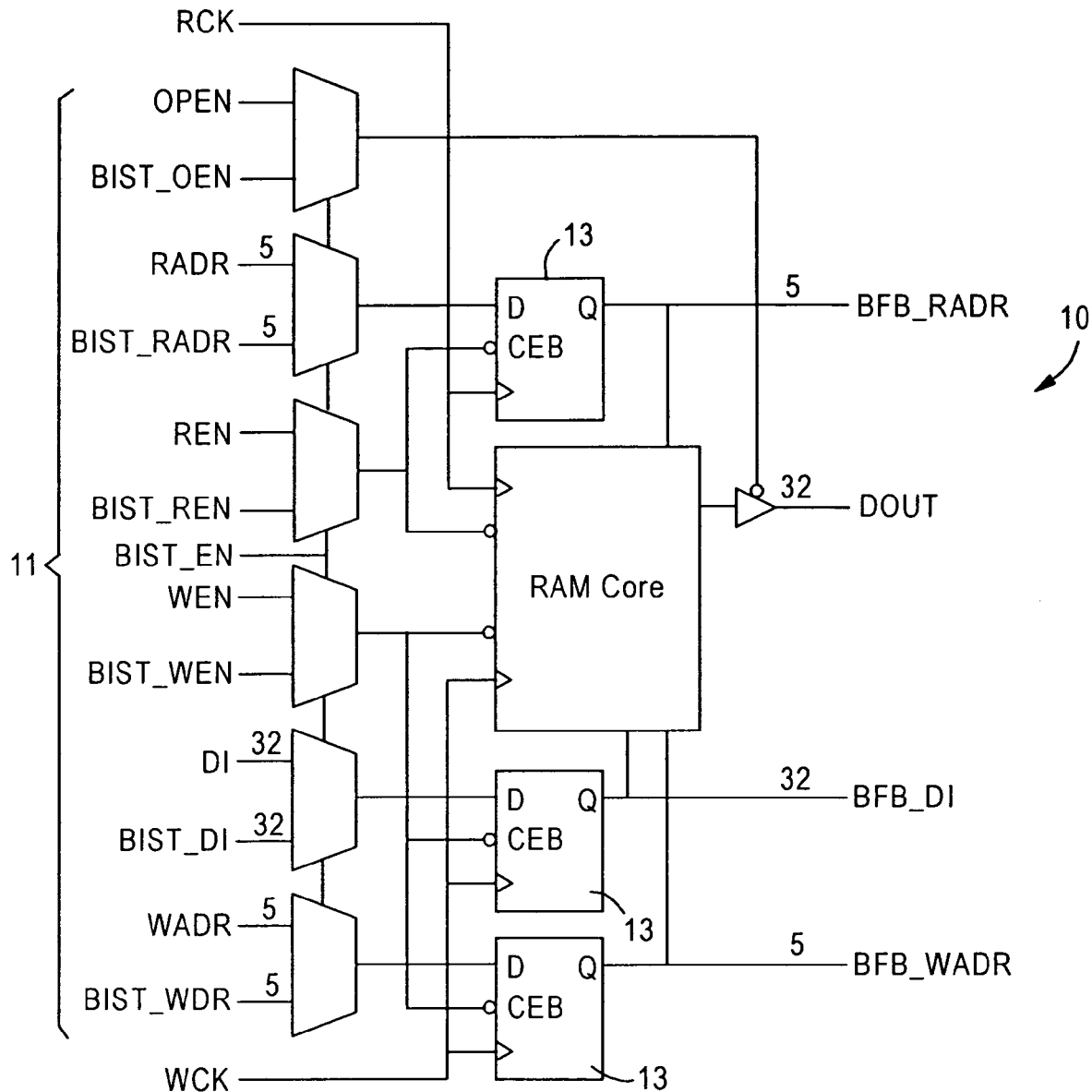
FIG. 1 is a block diagram of a typical (prior art) 32×32 RAM block of an integrated circuit.
Figure 2:
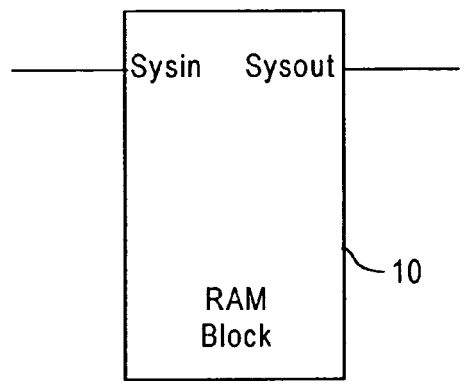
FIG. 2 is a simplified (prior art) block diagram of the RAM block of FIG. 1 without the ability to observe inputs and control outputs.
Figure 3:
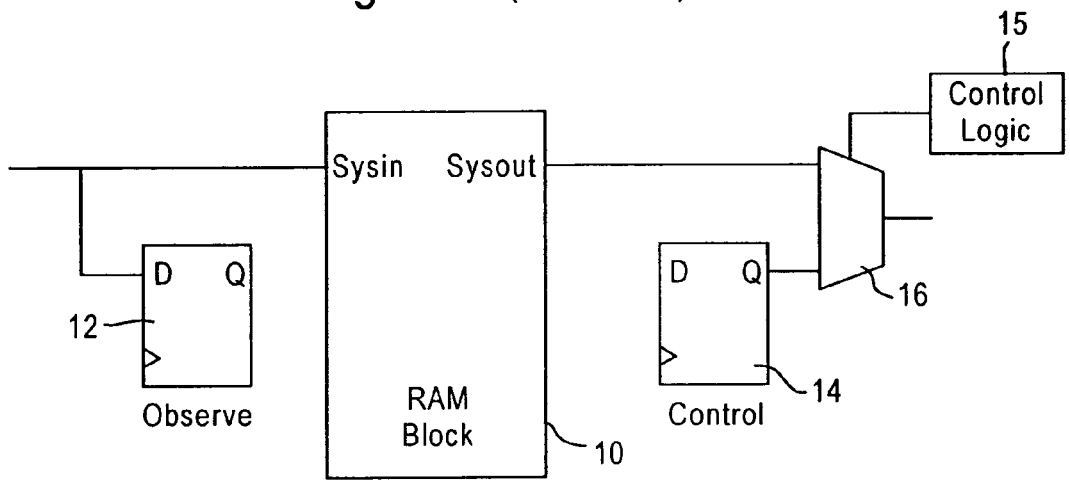
FIG. 3 is a (prior art) block diagram of the RAM block of FIG. 2; with a conventional observe flip-flop added to an input pin and a conventional flip-flop and mux added to an output pin.

With reference to FIG. 3, typically, in order to employ ATPG tools in testing the RAM block 10 of FIG. 2, a scan-only observe flip-flop 12 is provided to an input pin of a RAM block 10 for observing the signal that is input to the RAM block 10. In addition, a flip-flop 14 and a mux 16 are added to the output pin for controlling the output via control logic 15. Thus, ATPG tool loads 1s and 0s as desired to drive values to the downstream logic.

Figure 4:
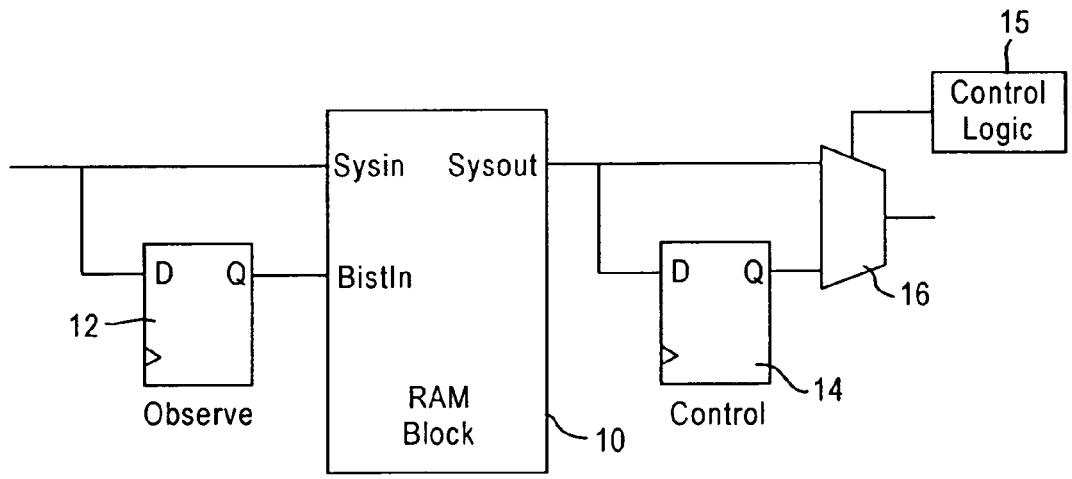
FIG. 4 is a block diagram of a RAM block with an observe flip-flop at the input, a control flip-flop and mux at the output, connected to provide ram scan capability in accordance with the principles of the present invention.

In accordance with an embodiment of the invention and with reference to FIG. 4, the flip-flops 12 and 14 are connected to provide RAM scan capability. Along with the observe function, the observe flip-flop 12 is now also used to drive an input pin (e.g., BistIn) of the RAM block 10. Furthermore, along with the control function, the scan control flip-flop 14 can capture the RAM outputs. Connecting flip-flops 12 and 14 in series provides a shift register that functions both as an internal scan chain and as a RAM scan chain, the function of which will be explained below.

Figure 5:
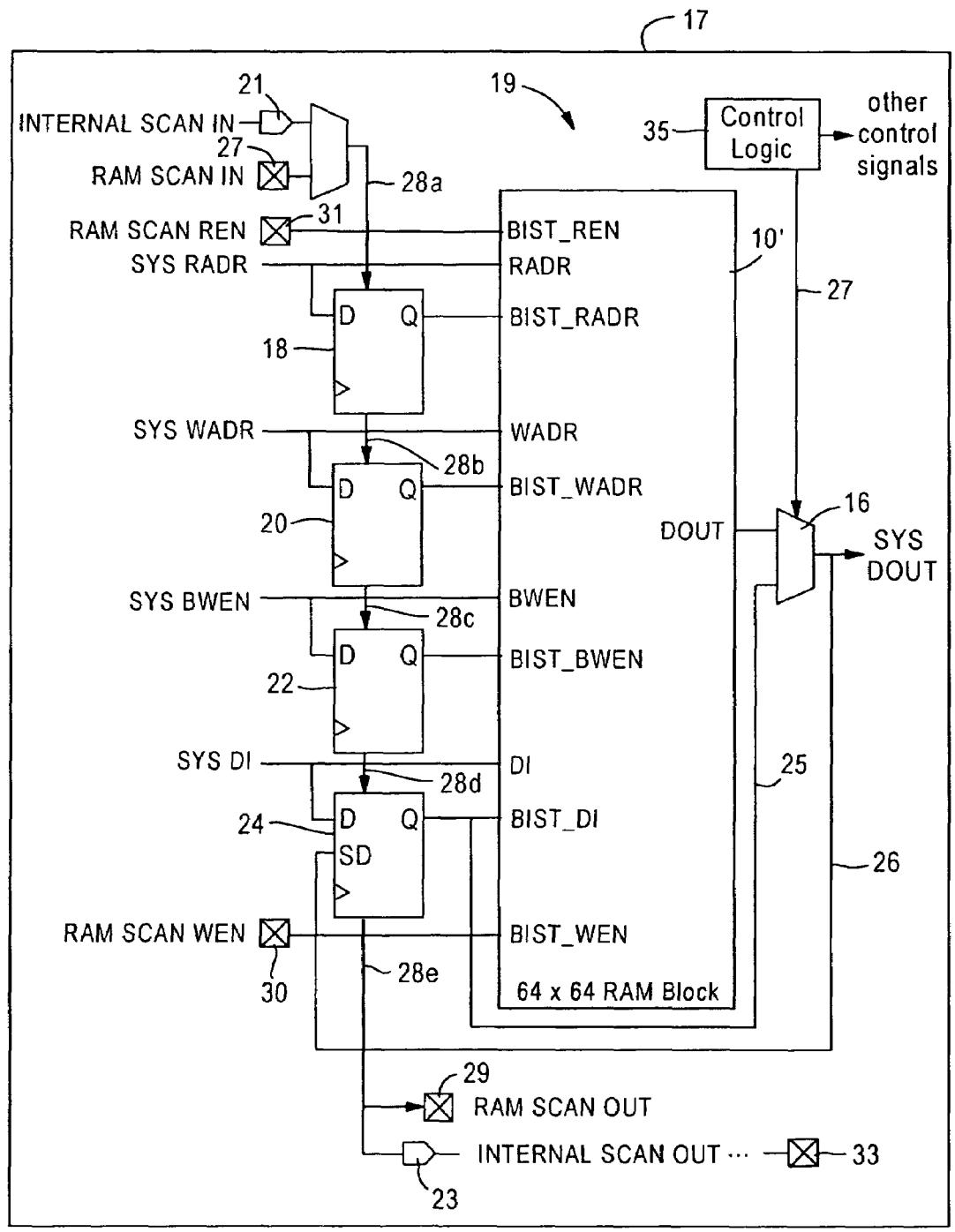
FIG. 5 is a block diagram of a RAM scan circuit embedded in a chip in accordance with the principles of the present invention.

FIG. 5 shows a block diagram of a RAM scan circuit 19 including a 64×64 RAM block 10' in accordance with an embodiment of the present invention that is part of an integrated circuit 17 (single chip). The two flip-flops 12 and 14 of FIG. 4 are replaced by a single flip-flop 24, to advantageously reduce the number of flip-flops required.

There are sixty-four flip-flops 24 (only one shown) connected in series for the RAM block 10', each sending a BIST_DI data signal to the RAM block 10'. The mux 16 is provided at the output of the RAM block 10'. In addition, flip-flop 18 sends a read address BIST_RADR to the RAM block 10'. Although not shown in FIG. 5, for the 64×64 RAM block 10', there are a total of six flip-flops 18 connected in series for the respective address bits. Flip-flop 20 sends a write address BIST_WADR to the RAM block 10'. For the 64×64 RAM block 10', there are also six flip-flops 20 (only one shown) connected in series for the respective address data bits. The flip-flop 22 feeds a byte write enable BIST_BWEN signal to the RAM block 10'. There are eight flip-flops 22 (only one shown) connected in series for the RAM block 10' for the respective data bits.

There are three modes in which the chip 17 containing the RAM scan circuits 19 operates. The first mode is a functional mode wherein the chip 17 operates as intended with the flip-flops 24 (FIG. 5) being non-functional. Signals SYS RADR, SYS WADR, SYS BWEN and SYS DI are employed in the functional mode.

The second mode of the chip 17 is a test mode and is called internal or ATPG scan mode. The flip-flops 18, 20, 22 and 24 operate as observe points for the signals that are input to the RAM block 10' and the output of the RAM block 10' can be controlled.

Figure 5A:
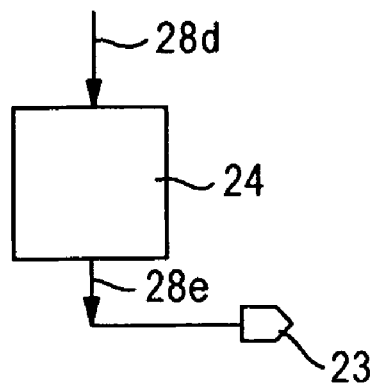
FIGS. 5*a*-5*c* each show an input and an output of a flip-flop of FIG. 5 during test modes.
Figure 5B:
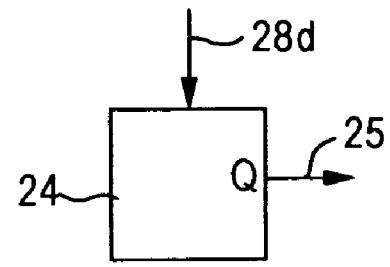

With reference to FIG. 5, to initiate an internal scan test of the circuit 19, a serial data stream is input at an INTERNAL SCAN IN node 21 to the flip-flops 18, 20, 22, and 24. More particularly, data is input via line 28*a* to flip-flop 18, the output 28*b* of flip-flop 18 is input to flip-flop 20, the output 28*c* of flip-flop 20 is input to flip flop 22, and the output 28*d* of flip-flop 22 is input to flip-flop 24 and the output of flip-flop 28*e* is sent to node 23 (FIG. 5*a*) which, as explained below becomes an input to other linked circuits, for example circuits 19', 19". It is noted that the RAM block 10' is not functional during the internal scan mode. The data captured in flip-flops 18, 20, 22 and 24 is sent to the node 23 and eventually through an internal scan chain to an output INTERNAL SCAN OUT 33 on the chip 17. If testing only one RAM Block 10', node 23 can be a pin. It is at this output pin 33 that the inputs are observed. In addition, with regard to flip-flops 24 the outputs Q thereof are input to the RAM block 10' and are also input to the mux 16 via bypass line 25 for controlling system data out SYS DOUT via control logic 35 and signal 27. FIG. 5*b* shows the input and output of a flip-flop 24 for use in controlling an output signal. Thus, for example, the input data captured by flip-flops 24 can be observed and the output signal from the RAM block 10' can be controlled. Since the RAM block 10' is bypassed via line 25, it is not an obstacle to the ATPG tools. Data input to flops 18, 20 and 22 is not used, but is replaced by data captured from the SYS_RADR, SYS_WADR, and SYS_BWEN RAM inputs so that faults on these signals can be observed when the scan chain is shifted out to a chip pin.

Figures 6, 7:
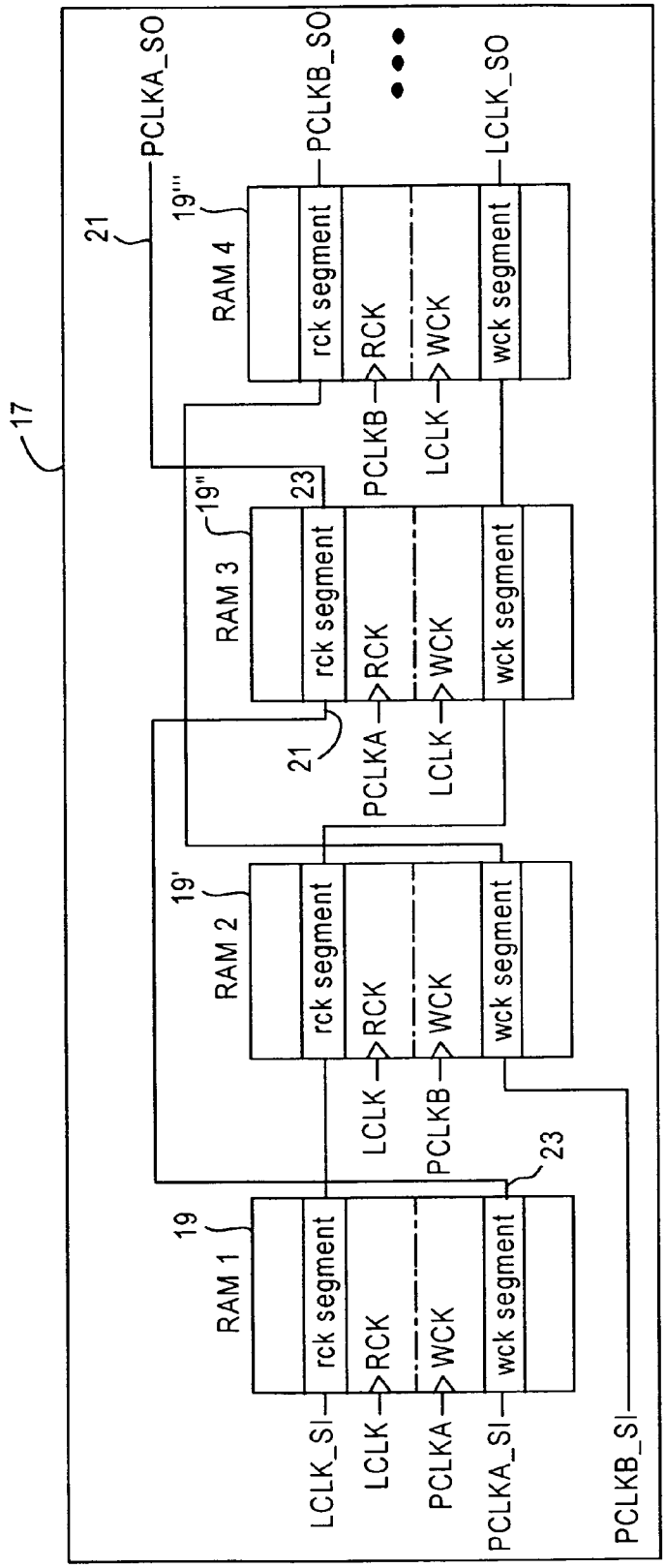
FIG. 6 is a block diagram of RAM segments stitched together to form a portion of an internal scan chain.
FIG. 7 is a diagram of the RAM segments of FIG. 6 forming tails of internal scan chains.

The flip-flops 18, 20, 22 and 24 of the single RAM scan circuit 19 of FIG. 5 define a portion of a large internal scan chain, since there are twenty-four RAM scan circuits in the embodiment of the chip 17. Thus, to test all twenty-four RAM scan circuits, the RAM scan circuits are linked. FIG. 6 shows four of the twenty-four RAM scan circuits 19, 19", 19'" and 19"" of the chip 17 linked together to form a portion of the internal scan chain. Each RAM block of a circuit is split across two clock domains: one read clock domain and one write clock domain. The read clock is tied to the RAM block 10' and to the flip-flops 18. The write clock is tied to the RAM block 10', the flip-flops 20, the flip-flops 22 and the flip-flops 24. The below list shows how the clocks of the chip 17 connect to the RAM blocks 10' of the twenty-four RAM scan circuits. There are four configurations of clock pairs for the twenty-four RAM block instances on the chip 17.

Chip 17 RAM block read clock ($1^{st}$ clock listed) and write clock ($2^{nd}$ clock) combinations:
Eight 32×32 LCLK—PCLKA
Eight 32×32 LCLK—PCLKB
Four 64×64 PCLKA—LCLK
Four 32×32 PCLKB—LCLK For the internal scan test, it is important to keep the flip-flops 18, 20, 22 and 24 in their own clock domain, otherwise, timing issues may arise. FIG. 6 shows how the LCLK segments are linked together to form a portion of a scan chain, including the read (rck) segments from RAM1, and RAM 2, and the write (wck) segments from RAM3 and RAM 4. The segments clocked by PCLKA and PCLKB are similarly linked. FIG. 7 shows how all the LCLK segments form the tail of one LCLK scan chain, likewise for PCLKA and PCLKB. It can be appreciated that in internal scan testing all twenty-four RAM scan circuits 19, a large amount of data (e.g., over 100,000 bits) is sent through the full internal RAM scan chain.

The third mode of the chip 17 is also a test mode and is called the RAM scan mode. As shown in FIG. 5, flip-flops 18, 20, 22 and 24 are connected in a series via lines 28a, 28b, 28c, and 28d, respectively. In this mode, serial data is provided from the primary input pin 27 (RAM SCAN IN) via line 28a, 28b, 28c, and 28d to the flip-flops (18, 20, 22 and 24) to set-up the RAM block 10'. In the embodiment, the serial data includes six read address (RADR) bits, six write address (WADR) bits, eight byte write enable (BWEN) bits, and sixty-four data (DI) bits. As will be described below, the serial data is output to the primary output pin 29 (RAM SCAN OUT). Because the ram scan chain crosses clock domains, a lockup latch (not shown) is added between RADR and WADR to prevent timing problems if the clocks in the two domains are skewed.

In FIG. 5, after the flip-flops 18, 20, 22 and 24 are serial loaded through the RAM scan chain, a trigger, e.g., a primary write enable input pin 30 (RAM SCAN WEN) is asserted (active low). The contents of WADR flip-flop 20, BWEN flip-flop 22 and DI flip-flop 24 are latched by the RAM block 10' on the next rising edge of the write clock. Thus, a RAM block write cycle is triggered.

Figure 5C:
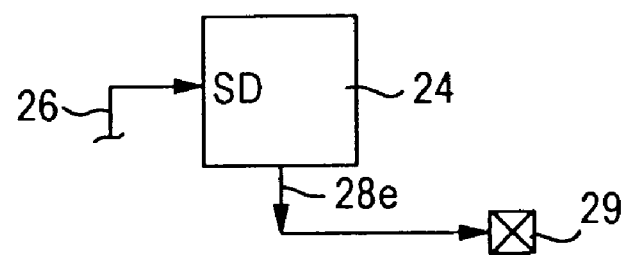

Since the flip-flops 18 have already been loaded as described above, a read cycle is initiated in response to asserting (active low) a trigger, e.g., a primary input pin 31 (RAM SCAN REN). On the next rising edge of the read clock, the contents of the flip-flops 18 are latched by the RAM block 10'. A RAM block read cycle is thus triggered. The sixty-four bits of data at the specified read address are transferred via line 26 to the flip-flops 24 and are then outputted via RAM SCAN output pin 29 (see FIG. 5c). Thus, in the RAM scan mode, the RAM block inputs are driven and the RAM block outputs are sampled, with a complete packet of data being tested. It can be appreciated that in the RAM scan mode, typically a series of write cycles are run to load the RAM and then a series of read cycles is run to verify the results. Write and read cycles can overlap.

In the embodiment, there are twenty-four RAM SCAN IN/OUT pairs; one pair for each of the twenty-four RAM blocks in the chip 17. There is one RAM SCAN WEN and one RAM SCAN REN that fan out to the sixteen 32×32 RAM block instances. A second pair (RAM SCAN WEN and RAM SCAN REN) fans out to eight 64×64 RAM block 10' instances. All twenty-four RAM blocks can be tested in parallel. All the primary pins mentioned are shared with existing functional chip pins.

FIGS. 8a-8c show three RAM scan cycles. The write cycle of FIG. 8a consists of shifting in 84 bits including DI (64 bits), BWEN (8 bits), WADR (6 bits), and RADR (6 dummy bits) into the chip 17. After the last bit is shifted in, a write memory cycle is triggered by asserting RAM SCAN WEN. A second write cycle can be overlapped with the first cycle.

The read cycle of FIG. 8b consist of shifting in RADR (6 bits), triggering a read cycle using RAM SCAN REN, and shifting out 64 bits of data. Shifting in a second RADR can be overlapped with shifting the data out. In FIGS. 8a and 8b, one "tick" corresponds to one clock cycle.

A burst read/write cycle is shown in FIG. 8c. It is conceivable to hold RAM SCAN WEN active low while pumping in random bits. This would trigger a RAM write cycle on every clock edge, writing a pseudo-random data pattern to pseudo-random bytes within a pseudo-random word. Likewise, RAM SCAN REN could be held low to trigger a burst of read cycles. However, each read cycle updates the data portion of the RAM scan chain with the contents of the memory location just read. Thus, during burst reads, it is not possible to shift out and verity the data that was read for each cycle.

Thus, the embodiment enables an internal scan mode and a RAM scan mode to effectively test RAM blocks that are embedded in a chip.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of testing a RAM block embedded in an integrated circuit, the method including:
   providing a scan circuit including a RAM block, a plurality of first flip-flops each sending a read address to the RAM block, a plurality of second flip-flops each sending a write address to the RAM block, a plurality of third flip-flops each sending an enable signal to the RAM block, a plurality of fourth flip-flops, and a multiplexer receiving an output from the RAM block, the first, second, third and fourth flip-flops being connected in series,
   performing an internal scan test by loading serial data into the first, second, third and fourth flip-flops, observing data captured by at least the fourth flip-flops, an output of each fourth flip-flop bypassing the RAM block and being received by the multiplexer, and controlling signals output by the multiplexer, and
   performing a RAM scan test by the combination of loading serial data into the first, second, third, and fourth flip-flops of the RAM block, triggering a RAM write cycle to latch data in the second, third and fourth flip-flops to the RAM block, triggering a RAM read cycle with data of the first flip-flops being latched by the RAM block and data of a specified read address being output from the RAM block and received by the multiplexer and by the fourth flip-flops, and outputting the data of the specified read address from the fourth flip-flops.

2. The method of claim 1, further including:
   employing Automatic Test Pattern Generation (ATPG) tools in the performance of the internal scan test.

3. The method of claim 1, wherein the RAM block is a 64×64 RAM block, the step of performing the RAM scan test includes inputting to the RAM block six read address bits, six write address bits, eight write address bits and sixty-four data bits.

4. The method of claim 1, wherein triggering the write cycle includes asserting a write enable signal.

5. The method of claim 1, wherein triggering the read cycle includes asserting a read enable signal.

6. The method of claim 1, wherein a plurality of scan circuits are provided, the method further including linking segments of certain flip-flops of the scan circuits to define an internal scan chain, and thereafter, performing the internal scan test.

7. An integrated circuit comprising:
   an embedded RAM scan circuit comprising:
      a RAM block,
      a plurality of first flip-flops each sending read address to the RAM block,
      a plurality of second flip-flops each sending a write address to the RAM block,
      a plurality of third flip-flops each sending a byte write enable signal to the RAM block,
      a multiplexer receiving an output from the RAM block,
      a controller constructed and arranged to control the multiplexer and thus the output from the RAM block,
      a plurality of fourth flip-flops each constructed and arranged to capture data so that the captured data can be observed, an output of each fourth flip-flop being connected with the multiplexer in a manner that bypasses the RAM block, thereby permitting signals output by the multiplexer to be controlled by the controller, an output of the multiplexer being received by each fourth flip-flop,
      the first, second, third, and fourth flip-flops being connected in series,
      input structure constructed and arranged to permit input of serial data to the plurality of first, second, third, and fourth flip-flops,
      a first trigger constructed and arranged to trigger a RAM write cycle to latch data in the plurality of second, third and fourth flip-flops to the RAM block,
      a second trigger constructed and arranged to trigger a RAM read cycle to output a specified read address from the RAM block that is received by the multiplexer and thus by the fourth flip-flops, and
      output structure constructed and arranged to permit an output of data from the fourth flip-flops.

8. The circuit of claim 7, wherein certain of the RAM block is a 64×64 RAM block.

9. The circuit of claim 7, wherein first trigger is an asserted write enable signal.

10. The circuit of claim 7, wherein second trigger is an asserted read enable signal.

11. The circuit of claim 7, where the input and the output structures are pins.

12. An integrated circuit comprising:
    an embedded RAM scan circuit comprising:
       a RAM block,
       first means for sending read addresses to the RAM block,
       second means for sending write addresses to the RAM block,
       third means for sending byte write enable signals to the RAM block,
       receiving means for receiving an output from the RAM block,
       means for controlling the receiving means and thus the output from the RAM block,
       fourth means for capturing data so that the captured data can be observed, an output of the fourth means being connected with the receiving means in a manner that bypasses the RAM block, thereby permitting signals output by the receiving means to be controlled by the means for controlling, an output of the receiving means being received by the fourth means,
       the first, second, third, and fourth means being connected in series,
       means for permitting input of a data to the plurality of first, second, third, and fourth means,
       means for triggering a RAM write cycle to latch data in the plurality of second, third and fourth means to the RAM block,
       means for triggering a RAM read cycle to output a specified read address from the RAM block that is received by the receiving means and thus by the fourth means, and
       means for permitting output of data from the fourth means.

13. The circuit of claim 12, wherein the RAM block is a 64×64 RAM block.

14. The circuit of claim 12, wherein the means for triggering a RAM write cycle is an asserted write enable signal.

15. The circuit of claim 12, wherein the means for triggering a RAM read cycle is an asserted read enable signal.

16. The circuit of claim 12, where the means for permitting input and for permitting output of data are pins.

17. The circuit of claim 12, wherein each of the first means, the second means, the third means, and the fourth means comprises a plurality of flip-flops.

18. The circuit of claim 12, wherein the receiving means is a multiplexer.

* * * * *